US007627792B2

(12) United States Patent
Di Ronza et al.

(10) Patent No.: US 7,627,792 B2
(45) Date of Patent: Dec. 1, 2009

(54) MEMORY BUILT-IN SELF REPAIR (MBISR) CIRCUITS/DEVICES AND METHOD FOR REPAIRING A MEMORY COMPRISING A MEMORY BUILT-IN SELF REPAIR (MBISR) STRUCTURE

(75) Inventors: Mario Di Ronza, München (DE); Yannick Martelloni, Poing (DE)

(73) Assignee: Infineon Technologies AG, Munich (DE)

( * ) Notice: Subject to any disclaimer, the term of this patent is extended or adjusted under 35 U.S.C. 154(b) by 993 days.

(21) Appl. No.: 10/777,025

(22) Filed: Feb. 11, 2004

(65) Prior Publication Data

US 2004/0225912 A1 Nov. 11, 2004

(30) Foreign Application Priority Data

Feb. 12, 2003 (EP) .............................. 03 002 698.3

(51) Int. Cl.
*G11C 29/00* (2006.01)
*G11C 7/00* (2006.01)
(52) U.S. Cl. ...................................... 714/710; 365/201
(58) Field of Classification Search ................. 714/710, 714/711, 718; 365/200–201
See application file for complete search history.

(56) References Cited

U.S. PATENT DOCUMENTS

| 5,153,880 | A | * | 10/1992 | Owen et al. ................. 714/710 |
| 5,161,157 | A | * | 11/1992 | Owen et al. ................. 714/710 |
| 5,588,115 | A | * | 12/1996 | Augarten ..................... 714/29 |
| 5,808,945 | A |   | 9/1998  | Arase |
| 6,011,734 | A | * | 1/2000  | Pappert ....................... 365/200 |
| 6,026,505 | A |   | 2/2000  | Hedberg et al. |
| 6,065,090 | A | * | 5/2000  | Deas .............................. 711/1 |
| 6,141,267 | A |   | 10/2000 | Kirihata et al. |
| 6,181,614 | B1 | * | 1/2001  | Aipperspach et al. ....... 365/200 |
| 6,640,321 | B1 | * | 10/2003 | Huang et al. ................. 714/720 |
| 6,795,942 | B1 | * | 9/2004  | Schwarz ..................... 714/718 |
| 6,862,703 | B2 | * | 3/2005  | Oonk .......................... 714/718 |

(Continued)

FOREIGN PATENT DOCUMENTS

DE          010256487 A1 * 12/2002

(Continued)

OTHER PUBLICATIONS

Chih-Hsien Hsu, "Novel Fault-Tolerant Techniques for High Capacity RAMs", IEEE, Dependable Computing Procedings, 2001, Dec. 19, 2001, pp. 11-18.*

(Continued)

*Primary Examiner*—Cynthia Britt
(74) *Attorney, Agent, or Firm*—Patterson & Sheridan, L.L.P.

(57) ABSTRACT

A method for repairing a memory comprising a Memory Built-In Self Repair (MBISR) structure comprises the steps of detection of defective storage cells, and redundancy allocation. The redundancy allocation step is carried out in such a way that it combines a row and/or column oriented redundancy repair approach with a word oriented redundancy repair approach. A Memory Built-In Self Repair (MBISR) device comprises at least one memory (2) with row and/or column redundancy, at least one row and/or column Memory Built-In Self Repair (MBISR) circuit (3), and a word redundancy block (4). Furthermore, a distributed MBISR structure as well as dedicated Column/Row MBISR circuits (3) are provided.

27 Claims, 8 Drawing Sheets

U.S. PATENT DOCUMENTS

| | | | |
|---|---|---|---|
| 6,928,377 B2 * | 8/2005 | Eustis et al. | 702/118 |
| 6,973,604 B2 * | 12/2005 | Davis et al. | 714/710 |
| 6,977,855 B2 * | 12/2005 | Callaway et al. | 365/201 |
| 2001/0056557 A1 | 12/2001 | Kawagoe et al. | |
| 2002/0108073 A1 | 8/2002 | Hughes | |
| 2002/0159305 A1 | 10/2002 | Yoo et al. | |
| 2002/0194546 A1 * | 12/2002 | Ooishi | 714/42 |
| 2004/0093540 A1 * | 5/2004 | Adams et al. | 714/718 |
| 2004/0123181 A1 * | 6/2004 | Moon et al. | 714/13 |
| 2004/0153925 A1 * | 8/2004 | Ronza et al. | 714/724 |
| 2004/0163015 A1 * | 8/2004 | Nadeau-Dostie et al. | 714/42 |

FOREIGN PATENT DOCUMENTS

FR 2811464 A1 * 1/2002

OTHER PUBLICATIONS

Tarr, et al., "Defect analysis system speeds Test and Repair of Redundant Memories," *M. Electronics*, Jan. 12, 1984, pp. 175-179, vol. 57, No. 1, VNU Business Publications, New York, U.S.A.

Ganapathy, et al, "Yield Modeling and Optimization of Large Redundant RAM's" *1990 International Conference on Wafer Scale Integration, WSI Design and Support Technology*, pp. 273-287, IEEE Comput. Soc.

Dilip K. Bhavsar, "An Algorithm for Row-Column Self-Repair of RAMs and Its Implementation in the Alpha 21264" *ITC International Test Conference*, 1999, pp. 311-318, *IEEE*.

Heon-Cheol Kim, "A BISR (Built-In Self-Repair) Circuit for Embedded Memory With Multiple Redundancies" *1999 IEEE*, pp. 602-605.

European Search Report for Application No. 03002698.3 dated Oct. 1, 2003.

Partial European Search Report for Application No. 03002698.3 dated Jul. 23, 2003.

Akira Tanabe et al., "A 30-ns. 64 Mb DRAM with Built-in Self-Test and Self-Repair Function", IEEE Journal of Solid-State Circuits, vol. 27, No. 11, pp. 1525-1531, Nov. 27, 1992, New York, US.

\* cited by examiner

☐ = Fault-free cell
▨ = Replaced fault-free cell
☰ = Replaced faulty cell
☷ = Unreplaced faulty cell

MEMORY BUILT-IN SELF REPAIR (MBISR) CIRCUITS/DEVICES AND METHOD FOR REPAIRING A MEMORY COMPRISING A MEMORY BUILT-IN SELF REPAIR (MBISR) STRUCTURE

CROSS-REFERENCE TO RELATED APPLICATIONS

This application claims foreign priority benefits under 35 U.S.C. §119 to co-pending European patent application number 03 002 698.3, filed Feb. 12, 2003. This related patent application is herein incorporated by reference in its entirety.

BACKGROUND OF THE INVENTION

1. Field of the Invention

The invention relates to methods and devices for repairing a memory utilizing a Memory Built-In Self Repair (MBISR) structure.

2. Description of the Related Art

Digital memories typically consist of two-dimensional arrays of elements (storage cells) each capable of storing N different data values, where N is the number of stable states of the storage cell. The cells of the array are arranged into rows and columns.

Due to uncontrollable factors, memories may contain randomly distributed defective cells after fabrication which cause the memory to be unusable even if faults affect very small parts of the entire cell array. The larger the memory array, the lower the probability that the array is fault-free. Memory defects fall into four basic categories:

Clustered cell defects: defects affecting only one or few neighbouring cells.

Row defects: defects affecting multiple cells laying on the same row of the memory array.

Column defects: defects affecting multiple cells laying on the same column of the memory array.

Periphery defects: defects affecting the memory array periphery (sense amplifiers, IOs, output multiplexers etc.).

To prevent most memories from being discarded after failing production tests due to scarcely distributed faults, groups of spare storage cells are provided which allow replacing the defective ones once they are detected. Generally, complex processing is required to identify optimal repair configurations; in addition, optimal repair configurations may not even be identified due to inefficient processing, thus leading to discarded memories which might be recovered instead.

Examples for state of the art methods for repairing a memory comprising a Memory Built-In Self Repair (MBISR) structure are described e.g. in Bhavsar, D. K.: "An Algorithm for Row-Column Self-Repair of RAMs and Its Implementation in the Alpha 21264".—Preprint: Int'l Test Conference 1999, pp. 1 to 8, and in Kim, H. C. et al.: "A BISR (Built-In Self-Repair) circuit for embedded memory with multiple redundancies".—IEEE 1999, pp. 602 to 605.

Classical repair strategies consist of replacing rows or columns for which at least one cell is defective. This simple criteria leads to excess waste of spare cells whenever the number of faulty cells in one row/column is significantly less than the total cells replaced.

New repair strategies are able to repair small groups of logically neighbouring cells (memory words) instead of complete rows and columns. Such word replacement is more flexible than row and column replacement in that it allows fixing sparse faulty cells, but it is not suitable for repairing column or periphery defects and, to some extent, row defects. Repair algorithms are not necessary for this type of redundancy, as words are replaced at testing run time after detection of faults.

Each state of the art solution (i.e. row/column and word oriented redundancy) can efficiently target only part of the above listed types of defects. To determine the optimal repair configuration, the data of all defective cells need to be stored for processing. In general, complex processing is required to identify the optimal repair configuration. The corresponding calculations are done either on or off chip.

Optimal repair configurations may not be identified due to inefficient processing, thus leading to discard memories which might be repaired instead.

SUMMARY OF THE INVENTION

It is an object of the present invention to provide a method for repairing a memory comprising a Memory Built-In Self Repair (MBISR) structure, which has an improved performance in comparison with the above described methods known from the state of the art, and to provide Memory Built-In Self Repair (MBISR) devices and Memory Built-In Self Repair (MBISR) circuits having an improved performance in comparison with Memory Built-In Self Repair (MBISR) devices and Memory Built-In Self Repair (MBISR) circuits from the state of the art, respectively. For some embodiments, a Memory Built-In Self Repair (MBISR) structure and a redundancy allocation method with related circuit infrastructure are utilized to combine classical repair strategies (row and column replacement) with new approaches (word replacement) to optimize the allocation of available redundant resources and to achieve the highest possible repair rate for any given memory configuration.

In this distributed Memory Built-In Self Repair (MBISR) structure, each memory array with row and column redundancies is provided with dedicated circuitry (Row/Column MBISR) which automatically allocates spare array resources to those rows and columns containing defects. In comparison with centralized Memory Built-In Self Repair (MBISR) structures known from the state of the art such a distributed Memory Built-In Self Repair (MBISR) structure according to embodiments of the present application has the advantage that it allows MBISR (Memory Built-In Self Repair) and MBIST (Memory Built-In Self Test) to be carried out simultaneously, thus saving testing time and money. The device and circuit structures according to embodiments of the present invention may allow fast calculation of spare row/column allocation without impacting the duration of MBIST (Memory Built-In Self Test) tests. Minimal hardware overhead is required for typical row/column redundancy implementations according to the invention. For some embodiments, memory arrays with MBISRs may be grouped to form larger memory subsystems. Either single or grouped arrays may be provided with a set of shared spare words which are used to repair faulty cells not covered by row and column redundancies.

When used in combination with word redundancies, the circuits allow minimizing the number of spare rows and columns, thus leading to significant reductions in system area, power, and cost. One single MBIST may serve multiple memories with row/column and word redundancies.

The method described herein may be used to optimize the usage of available spare memory resources. The technique utilizes a relatively simple algorithm which can be implemented with minimal hardware overhead in case of low spare row/column count. The technique is also scalable, as the number of faulty row/column registers depends on the number of spare rows and columns, not on the memory array size.

One single MBIST may serve multiple memories with embedded (row/column) and shared redundancies (word).

Further, the techniques described herein are suitable for either static and dynamic memories, and for all types of memory defects. Relatively few registers are required for calculating an optimal allocation of spare rows and column across one memory array. Faulty row/column registers can be shared among all memories to save circuit area. Spare row/column allocation logic may be suitable for fully testable softmacro design with a specialty MBIST required and an impact on single test execution time. Further, the circuits require only minimal extra power consumption during test and are independent from the internal structure of the memory array. Further, The techniques described herein may be suitable for multiple-pass tests, row/column, IO and word redundancy.

BRIEF DESCRIPTION OF THE DRAWINGS

Examples of preferred and advantageous embodiments of the invention will now be described hereinbelow with reference to the accompanying drawings in which.

DETAILED DESCRIPTION OF THE PREFERRED EMBODIMENT

Figure 1:
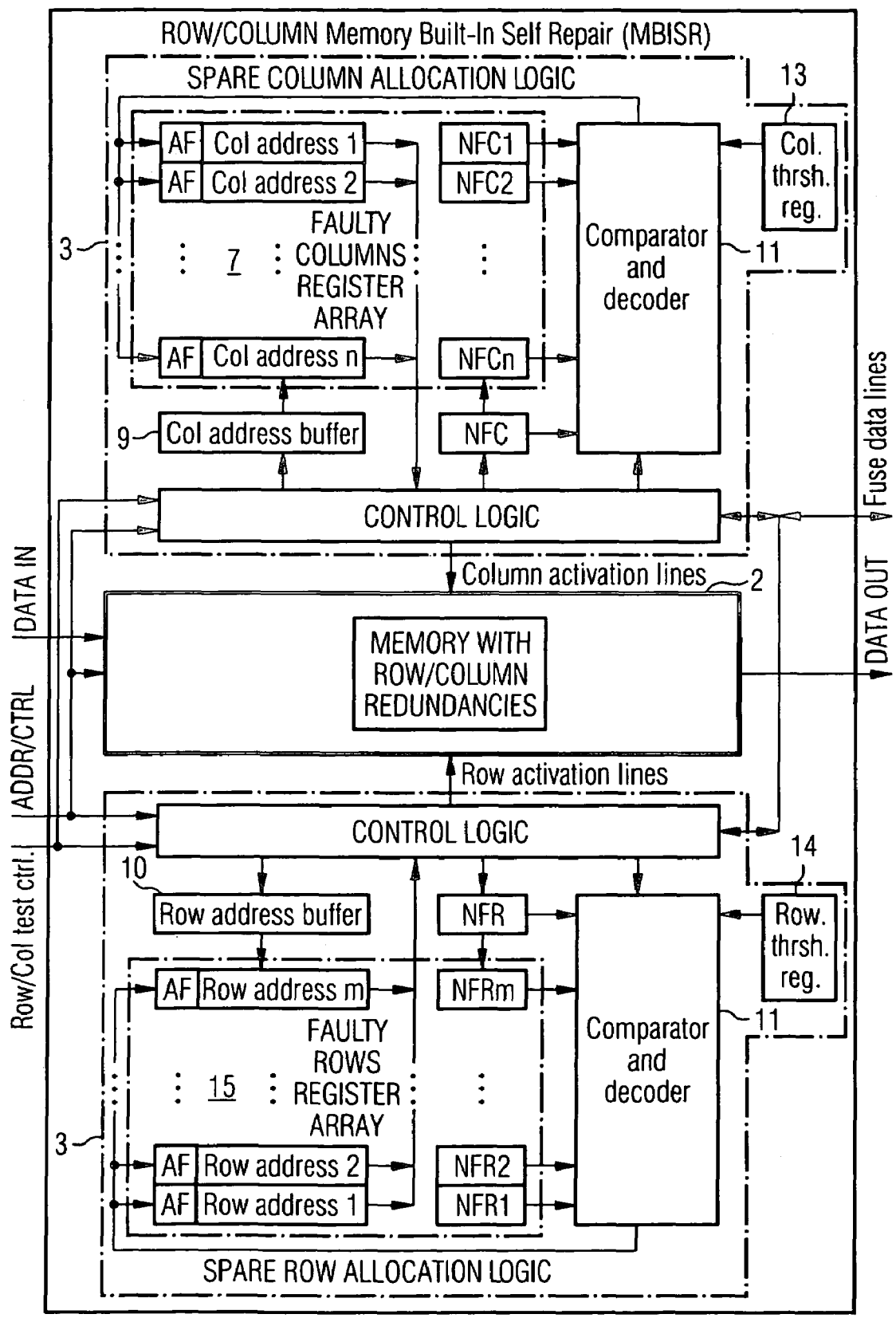
FIG. 1 is a schematic view of a Memory Built-In Self Repair (MBISR) device according to claim; one embodiment of the P-I.
Figure 2:
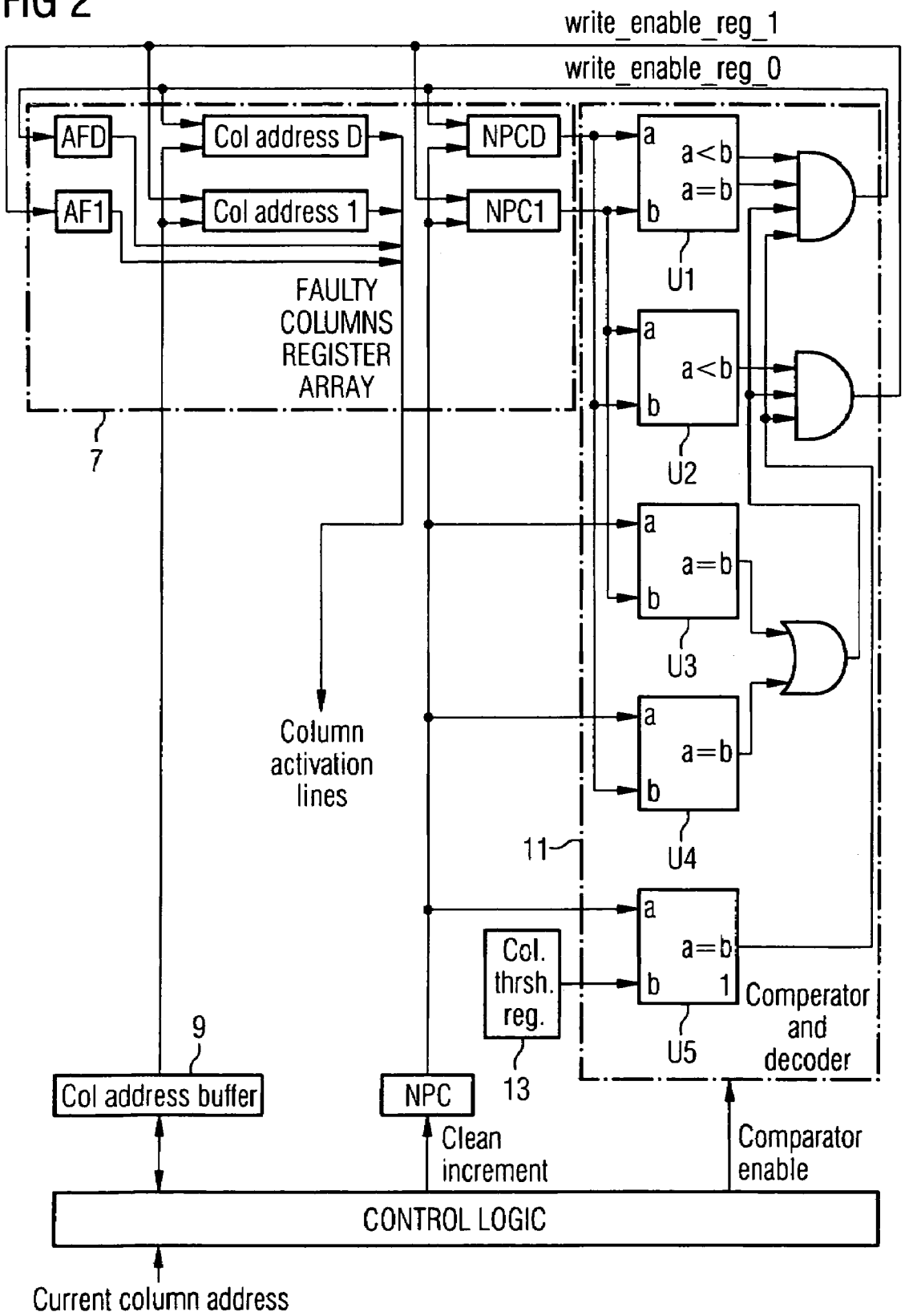
FIG. 2 is a more detailed representation of a Column Memory Built-In Self Repair (MBISR) circuit that may be used with the Memory Built-In Self Repair (MBISR) device of FIG. 1.

Circuit infrastructure needed to implement a spare row/column allocation as part of an embodiment of the method according to the invention is shown in FIGS. 1 and 2, wherein FIG. 2 is a more detailed representation of a Column Memory Built-In Self Repair (MBISR) circuit 3, which Column Memory Built-In Self Repair (MBISR) circuit 3 is part of the scheme of FIG. 1. Each memory array 2 (see also FIG. 3) with a given amount of spare rows and columns is provided with two independent spare row/column allocation circuits (Memory Built-In Self Repair (MBISR) circuits) 3, i.e. one Column Memory Built-In Self Repair (MBISR) circuit (see FIG. 2), and one Row Memory Built-In Self Repair (MBISR) circuit. It has to be understood that in the present example the principle structures of the Column Memory Built-In Self Repair (MBISR) circuit and of the Row Memory Built-In Self Repair (MBISR) circuit are the same. Hence, the detailed scheme of FIG. 2 showing an embodiment of the Column Memory Built-In Self Repair (MBISR) circuit applies to an embodiment of the Row Memory Built-In Self Repair (MBISR) circuit in the present example.

Each of the row/column allocation circuits 3 contains a set of faulty row/column registers (7, 15) which point to the rows and columns to be replaced, a comparator/decoder 11 which selects the faulty row/column registers to compare or write to during the memory tests, and a control logic which synchronizes the operation with the different test phases (row or column test) and provides the interface to non volatile faulty row/column storage elements (fuses).

Figure 3:
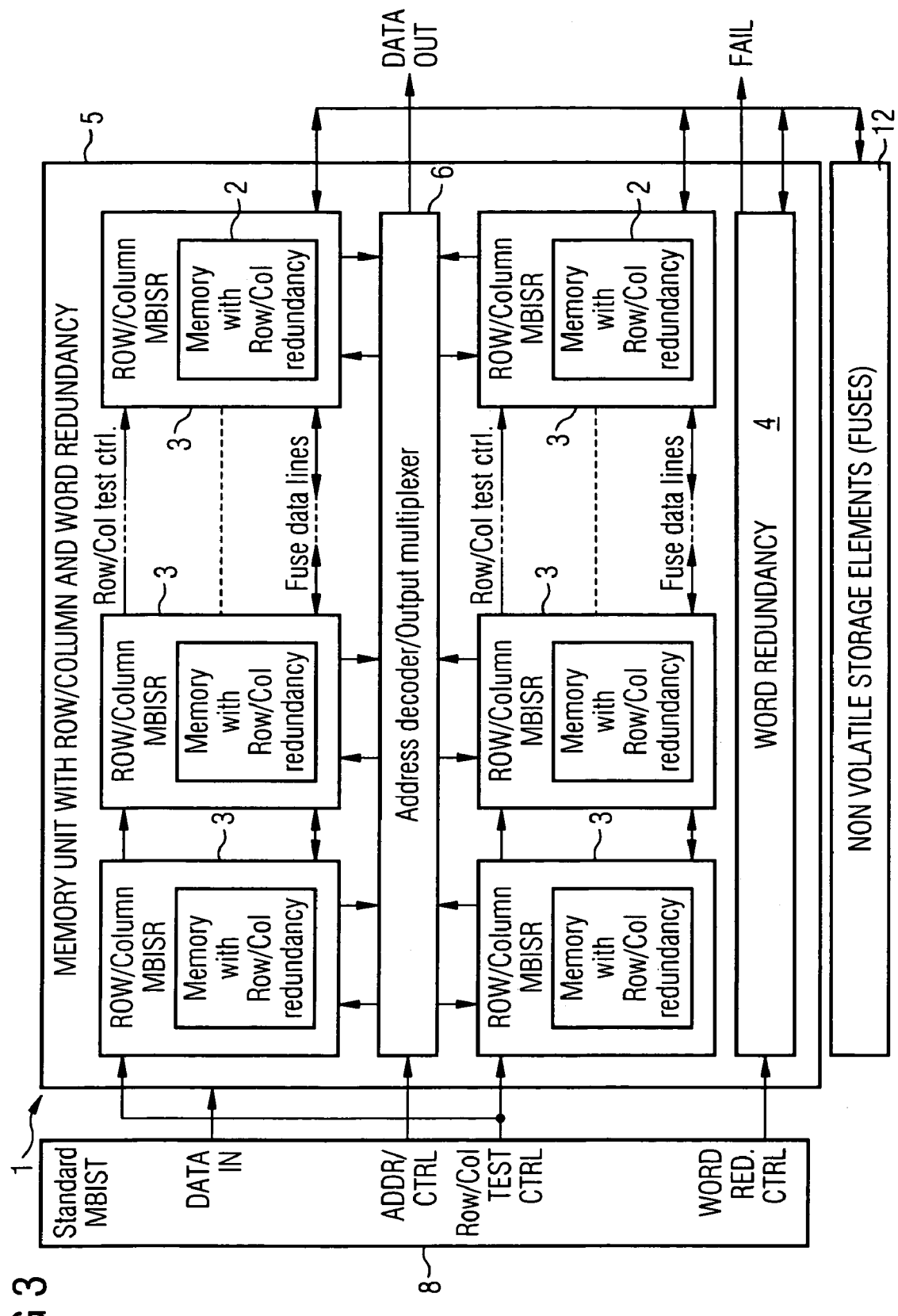
FIG. 3 is a schematic view of a redundant memory in AW EOTPI.

FIG. 3 shows an overall diagram of a memory unit 5 made of multiple memories with row/column redundancies 2, each provided with a dedicated MBISR 3, and a shared word redundancy block 4. The memory unit 5 is connected to a standard Memory Built-In Self Test (MBIST) controller 8 and a bank of non volatile storage elements (fuses) 12 serving all MBISRs 3 and the word redundancy block 4.

In more detail, each MBISR 3 as shown in FIG. 3 consists of one Column Memory Built-In Self Repair (MBISR) circuit and one Row Memory Built-In Self Repair (MBISR) circuit as to be seen in FIG. 1. I.e., the memory unit 5 of FIG. 3 carries six single schemes of the type shown in FIG. 1.

The embodiment of a Memory Built-In Self Repair (MBISR) device as shown in FIG. 3 illustrates just one embodiment of the Memory Built-In Self Repair (MBISR) device according to the present invention. Alternate configurations of embodiments of the Memory Built-In Self Repair (MBISR) device may contain only one set of row/column allocation circuits shared by all memory arrays 2 with spare rows and columns.

The spare row/column allocation method according to the present example is based on the simple rule that spare rows and columns must replace array rows and columns with the highest number of faulty cells. Faulty cells not covered by row/column redundancy, if any, will be replaced by redundant words as long as they are available, otherwise a FAIL signal is activated to flag that the memory 2 is not repairable.

Figure 4:
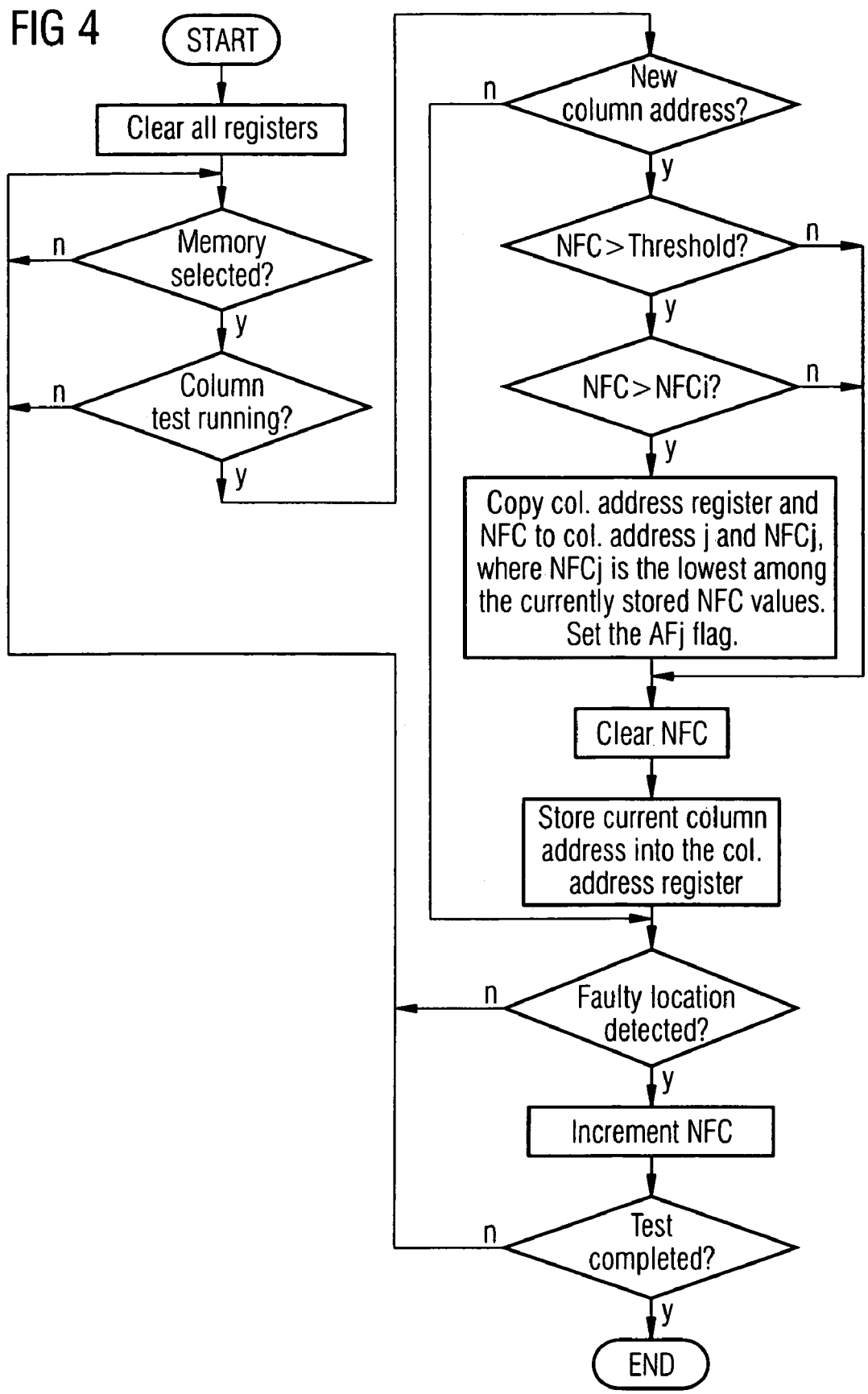
FIG. 4 is a flow chart of exemplary operations for spare column allocation in accordance with an embodiment of the invention.

As a prerequisite, the tester should check an entire row or column at a time and not portions of them. Row and column tests can be executed in any order, depending on which detection and repair strategy best fits the most frequent defects for any given memory technology. In this example it is assumed that spare column allocation is calculated first; as illustrated he method is shown in the flow diagram of FIG. 4.

Once started, all faulty column registers Col address register(i) (cf. FIG. 1), NFC(i) (see below), Row address register (k) and NFR(k) (see below) are cleared. Calculations may be placed in standby as long as the memory 2 is not selected or no column test is being performed, thus limiting the overall testing power consumption.

During column tests, a column address buffer (Col address buffer) 9 (cf. FIG. 1) stores the address of the last column accessed; a Number of Faults in Column register (NFC) (cf. FIG. 1) is incremented each time a fault in the column pointed by the Col address buffer 9 is detected, thus storing the number of faulty cells belonging to that column.

Whenever the column address changes, the value stored in the NFC register is compared with a fixed first threshold beyond which it is considered worthwhile to replace an entire column in the cell array. If there are too few faulty cells in a column, that may be even fixed by using redundant words or wordlines instead, the NFC register is cleared and calculation restarts from the next column being tested (if the first threshold value is set to 0, a spare column might be used to fix an array column with at least 1 defective cell). The value of the column replacement threshold, i.e. the first threshold, is stored in a column threshold register 13 (see FIG. 1).

Should the first threshold be exceeded, the current value in the NFC register is compared to those stored in NFC(i) registers of a faulty columns register array 7, where the index i ranges from 1 to the number n of available spare columns (see FIG. 1). If there is at least one value of i for which it results NFC>NFC(i), i.e. the value stored in the NFC register is greater than at least one of those stored in the NFC(i) registers, then the values in the Col address buffer 9 and NFC registers are copied to the Col address register(j) and NFC(j) pair with the lowest value NFC(j) among all current NFC(i), with an Activation Flag AF(j) being (re)asserted to indicate that the Col address registers) register contains an effective faulty column address (cf. FIG. 1).

Once the Activation Flag AF(j) is asserted, the corresponding spare column is activated and the faulty array column is replaced therefore there will be no more faults detected at that column until the values at Col address registers) and NFC(j) are overwritten. Spare columns are dynamically assigned to faulty array columns at test runtime, which prevents the same faulty column from being pointed to by more than one Col address register(i)/NFC(i) pair (which would happen if the test scans all columns multiple times and in different orders).

Figure 5:
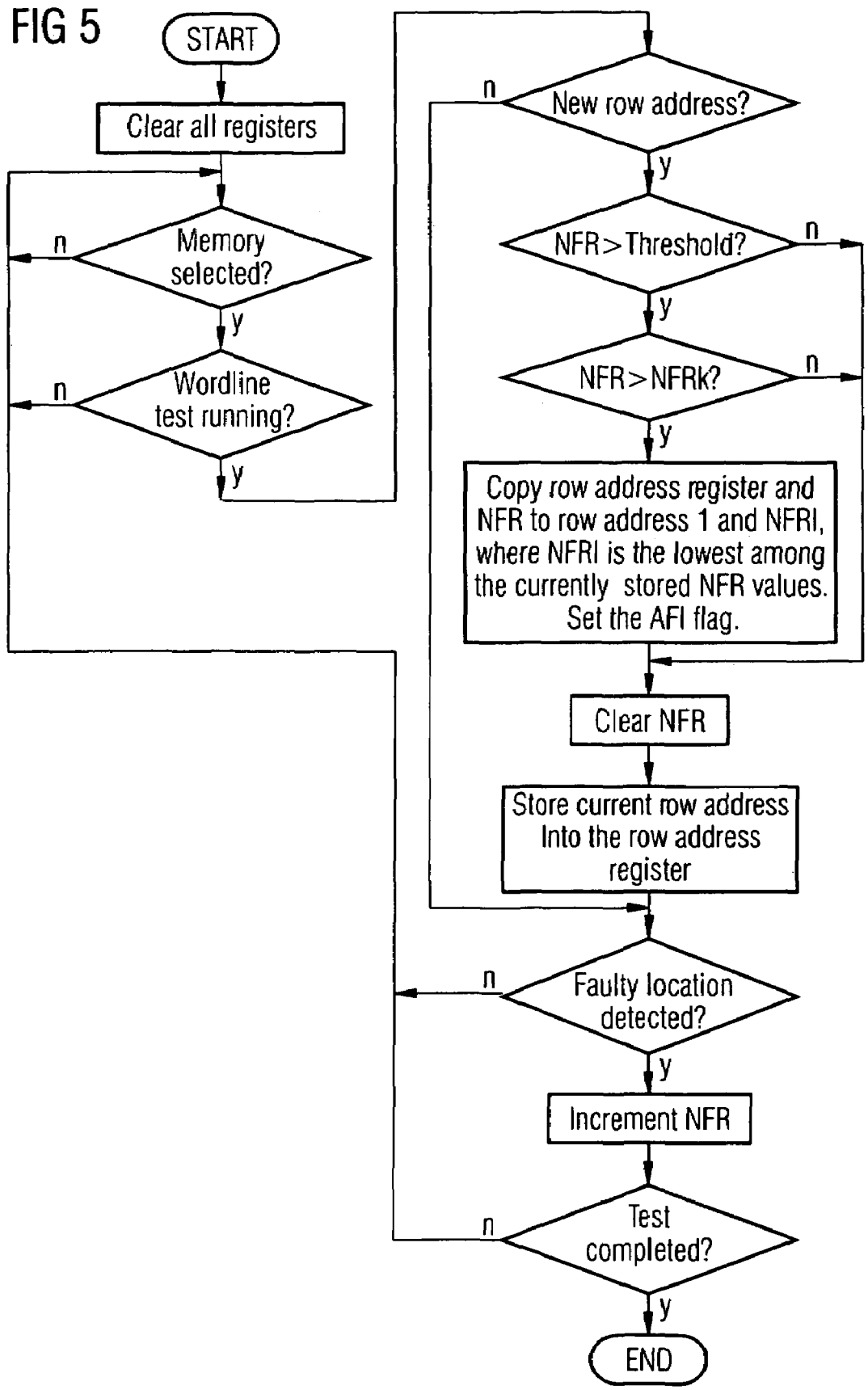
FIG. 5 is a flow chart of exemplary operations for spare row allocation in accordance with an embodiment of the invention.

The same method applies to spare row allocation (FIG. 5). During row tests, a Row address buffer 10 points to the last row accessed. A Number of Faults in Row (NFR) register (cf. FIG. 1) is incremented each time a fault in the row pointed by the Row address buffer 10 is detected, thus storing the number of faulty cells belonging to that row.

Whenever the row address changes, the value stored in the NFR register is compared with a fixed second threshold beyond which it is considered worth to replace an entire row in the cell array; if there are too few faulty cells in a row, that may be even fixed by using redundant words instead, the NFR register is cleared and calculation restarts from the next row being tested (if the second threshold value is set to 0, a spare row might be used to fix an array row with at least 1 defective cell). The value of the row replacement threshold, i.e. the second threshold, is stored in a row threshold register 14 (see FIG. 1).

Should the second threshold be exceeded, the current value in the NFR register is compared to those stored in the NFR(k) registers of a faulty rows register array 15, where the index k ranges from 1 to the number m of available spare rows (See FIG. 1). If there is at least one value of k for which it results NFR>NFR(k), i.e. the value stored in the NFR register is greater than at least one of those stored in the NFR(k) registers, then the values in the Row address buffer 10 and NFR registers are copied to the Row address register(l) and NFR(l) pair with the lowest value NFR(l) among all current NFR(k), with an Activation Flag AF(l) being (re)asserted to indicate that the Row address register(l) register contains an effective faulty row address.

Once the Activation Flag AF(l) is asserted, the corresponding spare row is activated and the faulty array row is replaced, therefore there will be no more faults detected at that row until the values at Row address register(l) and NFR(l) are overwritten. Spare rows are dynamically assigned to faulty array rows at test runtime, which prevents the same faulty row from being pointed to by more than one Row address register(k)/NFR(k) pair (which would happen if the test scans all rows multiple times and in different orders).

One advantage of this method is the handling of only the number of faulty cells per row/column, regardless of how these cells are distributed within rows, columns and words. The repair strategy aims to fix as many faulty cells as possible by means of spare rows and columns, any additional unfixed cells being replaced with redundant words. Values in the faulty row/column registers can be stored in any order.

Each time the current values of Col address buffer/NFC or Row address buffer/NFR must be stored into the faulty row/column registers, the pair with the lowest value of NFC(j) or NFR(l) is overwritten. The number of faulty row/column registers is fixed (equal to the number of spare rows/columns) and does not depend from the size of the memory 2. Once finished, the highest fault counts will be stored in the NFC(i) and NFR(k) registers along with the row/column addresses they refer to; registers Col address register(i) and Row address register(k) are used to activate spare columns and rows, respectively, thus maximizing the number of faulty cells which can be repaired using these redundancies.

As the algorithm simply overwrites faulty row/column registers as needed, no additional logic is needed to check whether free registers are available or whether the current row/column address is already stored into the faulty row/column registers.

Figure 6:
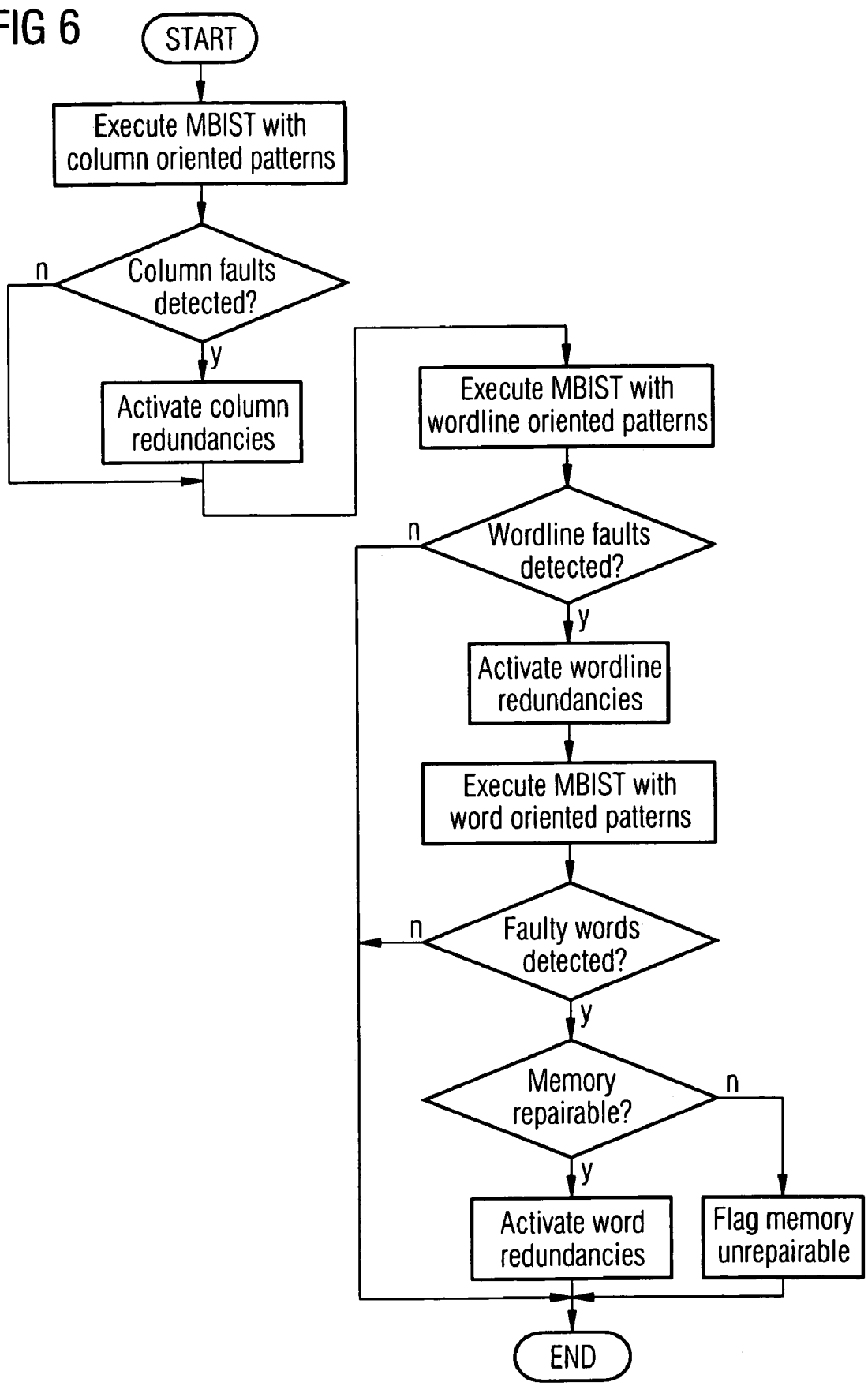
FIG. 6 is a flow chart illustrating a test/repair sequence in accordance with an embodiment of the invention.

FIG. 6 shows an example of a memory test/repair sequence in accordance with the invention illustratively, (column test is executed first). When detected, faulty array columns are replaced at test runtime. This prevents row test from detecting the same faults detected by column test. During row test, faulty array rows are replaced by spare rows. If no faulty row is detected then the test to detect faulty words is skipped, thus saving testing time (there is no need to test memory words if no faulty wordline was found), otherwise memory word test is executed afterwards.

Detected faulty words (i.e. memory words with at least one faulty cell) are repaired by activating redundant words as long as spare words are available; should no more spare word be available, signal FAIL is activated to flag that the memory is not repairable and execution ends, otherwise all memory faults are repaired (additional memory tests may optionally be performed to check that no faults are detected after completion of the test/repair sequence).

Figure 7:
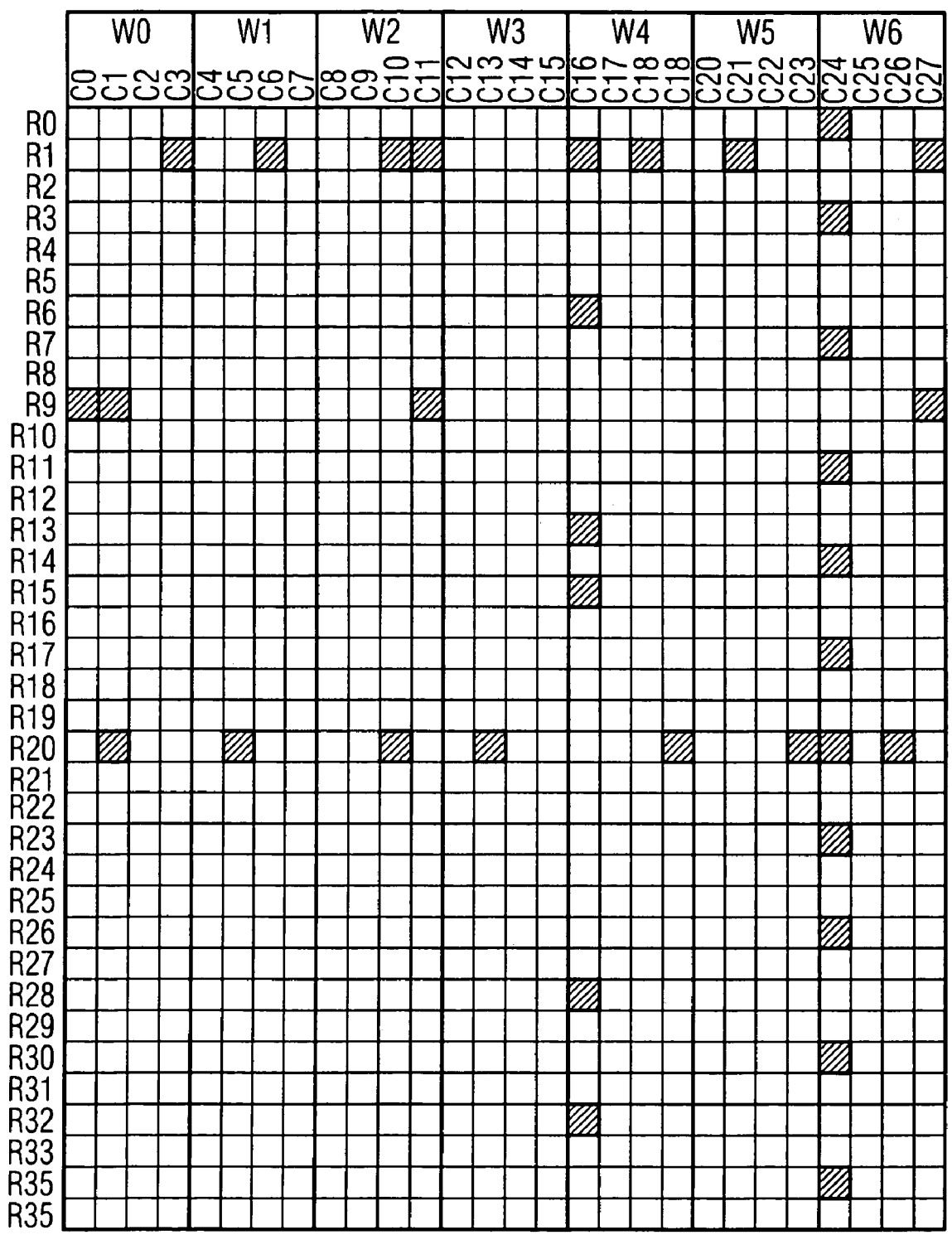
FIG. 7 shows a schematic view of an example of a memory array with faulty cells, prior to repair.

A memory array sample is shown schematically in FIG. 7. For simplicity it is assumed that the physical and the logical organization of the cell array are the same, e.g., arranged into 36 rows (R0 to R35) and 28 columns (C0 to C27). Each subsequent group of 4 columns forms one memory word, therefore each row is logically split into 7 words of 4 cells each (W0 to W6).

The method applies to real array structures as well, for which memory word bits are interleaved. Illustratively, the array is provided with 2 spare rows and 2 spare columns, therefore each spare allocation circuit will contain two Col/Row address buffer/NFR/NFC pairs. In addition, there are 4 spare words that can be shared among all the arrays in the memory unit. Both column and row thresholds are set to 2, that means that a spare column or row is used to repair columns and rows with at least 3 faulty cells.

The memory is tested according to the sequence as described above with reference to FIG. 6, with rows being scanned from R0 to R35 and columns from C0 to C27. Illustratively, column test is executed first. Once the column test is started, all faulty column registers are set to 0:

Col address register 0=0; NFC 0=0
Col address register 1=0; NFC 1=0

Due to the threshold value being set to 2, faulty column registers are not updated until column C16 is reached. As C16 contains 6 faulty cells (see FIG. 7), faulty column registers are updated as shown below (in case of more of one registers containing the lowest value, it can be assumed that the one with the lower index is overwritten):

Col address register 0=16; NFC 0=6
Col address register 1=0; NFC 1=0

As activation flag AF0 is set to 1, column C16 is replaced with a spare column and no further faults will be detected at column C16 unless the spare column is reassigned to another faulty column during the test.

The test continues and no updates occur until C24, containing 11 faulty cells, is reached. The content of Col address buffer/NFC is then compared to those of faulty column registers and, since it is greater than both, after the first comparison it is written to the faulty column register with the lowest value of NFC:

Col address register 0=16; NFC 0=6
Col address register 1=24; NFC 1=11

Again, flag AF1 is set to 1 and column C24 is replaced with the second spare column available.

The test proceeds until C27, as no further updates occur, array columns C16 and C24 are replaced according to values stored into Col address register 0 and Col address register 1. Once faulty columns are repaired, the row test is started. Generally, rows are tested on a word by word basis, i.e. the number of faults per row equals the number of words on the same row containing at least one failing cell. Once the row test is started, all faulty row registers are set to 0:

Row address register 0=0; NFR 0=0
Row address register 1=0; NFR 1=0

No faulty row registers updates occur until row R1, containing 6 faulty words (see FIG. 7), is reached. The faulty row is stored into faulty row registers as shown below:

Row address register 0=1; NFR 0=6
Row address register 1=0; NFR 1=0

As activation flag AF0 is set to 1, row R1 is replaced with a spare row and no further faults will be detected at row R1 unless the spare row is reassigned to another faulty row during the test. Due to the row threshold being set to 2, the next update occurs at row R9, containing 3 faulty words. The faulty row register with the lowest value of NFR is updated:

Row address register 0=1; NFR 0=6
Row address register 1=9; NFR 1=3

Flag AF1 is set to 1 and row R9 is replaced with the second spare row available.

Then, 7 faulty words are detected at row R20. As 7 is greater than either the values at NFR 0 and NFR 1, the faulty row register with the lowest value of NFR (i.e. NFR 1) is again updated:

Row address register 0=1; NFR 0=6
Row address register 1=20; NFR 1=7

The second spare row is reassigned to row R20 which contains more faulty cells.

The test proceeds until R35 and, as no further updates occur, spare rows are activated to replace array rows R1 and R20 according to values stored into Row address register 0 and Row address register 1. At the end of row/column tests, Col/Row address buffers will point to rows and columns with the highest number of faults.

Figure 8:
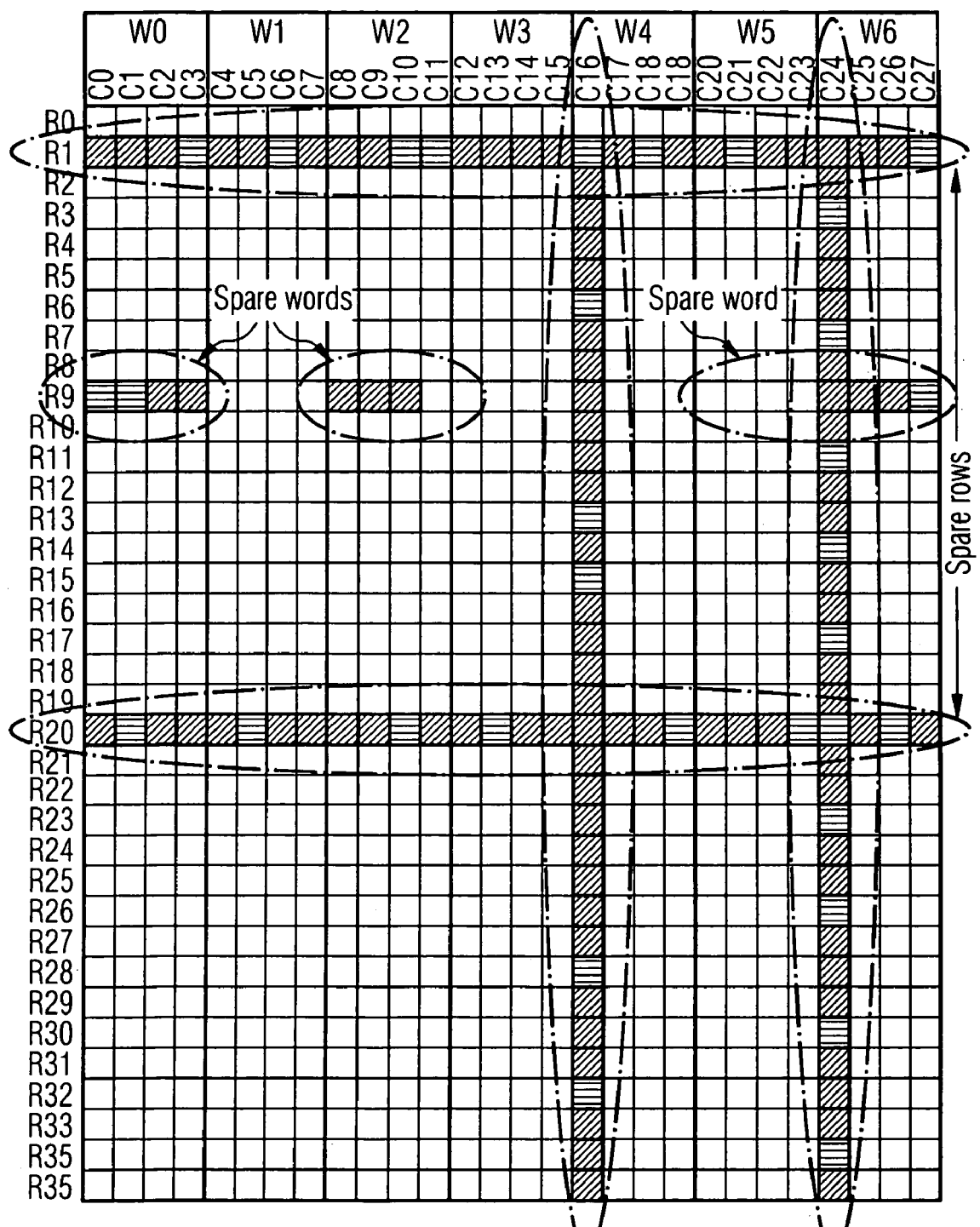
FIG. 8 shows the memory of FIG. 7 after repair.

Once faulty rows are repaired, the row test is started again and no faulty rows are detected except R9 which contains 3 faulty words. Row R9 is repaired by means of 3 spare words, the fourth spare word being left unused. The memory array after repair is shown in FIG. 8. The result is independent of the scanning direction used during tests. In the example shown, no repair would be possible if the spare row allocation algorithm would have replaced rows R1 and R9. In other words, row R20 would have needed 7 redundant words to be repaired versus the 4 spare words available.

For example, although fuses represent a widely used example for non-volatile storage elements for storage of fault data, there are other non-volatile storage elements which could be used instead.

While the foregoing is directed to embodiments of the present invention, other and further embodiments of the invention may be devised without departing from the basic scope thereof, and the scope thereof is determined by the claims that follow.

What is claimed is:

1. A method for repairing a memory device having at least one array of memory cells arranged in rows and columns with each row further divided into a plurality of words, the method comprising:
   detecting defective storage cells;
   conducting one of a column test and a row test comprising identifying and storing addresses of a respective one of columns and rows having one or more defective storage cells;
   overwriting stored addresses of one of columns and rows having a first number of defective storage cells with addresses of one of columns and rows having a second number of defective storage cells, wherein the second number is greater than the first number;
   replacing at least one of a row and column having a stored address with a redundant row or column; and thereafter
   replacing at least one word containing one or more defective storage cells with a redundant word without replacing the entire row containing the at least one word.

2. The method of claim 1, further comprising allocating redundant rows or columns used for replacement among rows or columns, respectively, based on the number of defective storage cells contained therein.

3. The method of claim 2, comprising allocating a redundant row or column to a first row or column containing defective storage cells in preference over a second row or column containing a lesser number of defective storage cells.

4. The method of claim 3, further comprising replacing the defective storage cells of the second row or column with one or more redundant words.

5. The method of claim 4, wherein one redundant word replaces defective storage cells of at least two columns.

6. The method of claim 4, further comprising activating a FAIL signal to indicate the memory device is not repairable if all defective cells detected cannot be replaced.

7. The method of claim 1, wherein the method is performed as part of a built-in self test (BIST) of the memory device.

8. The method of claim 7, wherein the BIST serves multiple memory devices with embedded and shared redundant elements.

9. The method of claim 1, wherein detecting defective storage cells comprises conducting a column test.

10. The method of claim 9, wherein conducting the column test comprises identifying and storing addresses of columns having greater than a threshold number of defective storage cells.

11. The method of claim 9, wherein detecting defective storage cells comprises conducting a row test.

12. The method of claim 1, wherein detecting defective storage cells comprises conducting a row test.

13. The method of claim 12, wherein conducting the row test comprises identifying and storing addresses of rows having greater than a predefined threshold number of defective storage cells.

14. A self-repairing memory device comprising:
at least one array of storage cells arranged in columns and rows, with each row comprising multiple words;
at least one of redundant row or column elements for replacing rows or columns containing defective storage cells;
at least one block of redundant word elements for replacing words containing defective storage cells without replacing the entire rows containing the words being replaced; and
built-in self repair (BISR) circuitry configured to:
conduct one of a column test and a row test comprising identifying and storing addresses of respective one of columns and rows having one or more defective storage cells, and overwriting stored addresses of one of the columns and rows having a first number of defective storage cells with addresses of one of columns and rows having a second number of defective storage cells, wherein the second number is greater than the first number; and
replace at least one of a row and column having a stored address with a redundant row or column element and, after completion of the replacement of the at least one of a row and column by the redundant row or column element, to replace at least one word containing one or more defective storage cells with a redundant word element without replacing the entire row containing the at least one word.

15. The self-repairing memory device of claim 14, wherein:
the built-in self repair (BISR) circuitry is configured to allocate redundant row or column elements to rows or columns containing defective storage cells based on the number of defective storage cells contained therein.

16. The self-repairing memory device of claim 15, wherein:
the built-in self repair (BISR) circuitry is configured to replace, with redundant word elements, defective storage cells contained in rows or columns not allocated redundant row or column elements.

17. The self-repairing memory device of claim 15, wherein:
the at least one array of storage cells comprises multiple arrays of storage cells; and
at least two of the arrays of storage cells share the block of redundant word elements.

18. The self-repairing memory device of claim 15, wherein:
the at least one array of storage cells comprises multiple arrays of storage cells;
the at least one of redundant row or column elements for replacing rows or columns containing defective storage cells comprises redundant row elements and redundant column elements; and
each array of storage cells is provided with at least one BISR circuit.

19. The self-repairing memory device of claim 14, wherein the storage cells are dynamic storage cells.

20. The self-repairing memory device of claim 14, wherein the built-in self repair (BISR) circuitry comprises:
row test circuitry; and
a plurality of registers to store address of rows containing at least a first threshold number of defective memory cells, as detected by the row test circuitry.

21. The self-repairing memory device of claim 20, wherein the built-in self repair (BISR) circuitry further comprises:
column test circuitry; and
a plurality of registers to store address of columns containing at least a second threshold number of defective memory cells, as detected by the row test circuitry.

22. The self-repairing memory device of claim 14, wherein the built-in self repair (BISR) circuitry comprises:
column test circuitry; and
a plurality of registers to store address of columns containing at least a threshold number of defective memory cells, as detected by the column test circuitry.

23. The self-repairing memory device of claim 14, further comprising:
a bank of non-volatile storage elements to store addresses of at least one of rows or columns to be replaced with redundant rows or column elements.

24. The self-repairing memory device of claim 14, further comprising a memory built-in self test (BIST) circuit to identify defective storage cells.

25. A memory built-in self repair device, comprising:
a plurality of memories, each of said memories having an array of storage cells arranged in columns and rows, with each row comprising multiple words,
a plurality of memory built-in self repair circuits, each memory built-in self repair circuit being associated to one of the plurality of memories and being configured to allocate at least one of redundant row elements and column elements for replacing respective one of rows and columns of the associated memory having defective storage cells, and
at least one block of redundant word elements for replacing words containing defective storage cells without replacing the entire rows containing the words being replaced, wherein one block of redundant word elements is used for replacing words containing defective storage cells of the plurality of memories, and wherein replacing of the at least one word with a redundant word is accomplished after replacement of all rows or columns with redundant rows or columns.

26. A method for repairing a memory device having at least one array of memory cells arranged in rows and columns with each row further divided into a plurality of words, the method comprising:
detecting a defective storage cell;
conducting one of a column test and row test comprising identifying and storing addresses of respective one of columns and rows having greater than a predefined number of defective storage cells;
replacing at least one of a row and column having a stored address with a redundant row or column; and thereafter
replacing at least one word containing one or more defective storage cells with a redundant word without replacing the entire row containing the at least one word.

27. A self repairing memory device, comprising:
at least one array of storage cells arranged in columns and rows, with each row comprising multiple words;
at least one or redundant row and column elements for replacing respective one or rows and columns comprising defective storage cells;
at least one block of redundant word elements for replacing words containing defective storage cells without replacing entire rows comprising the words being replaced; and
built in self repair (BISR) circuitry configured to:
  conduct a column or row test comprising identifying and storing addresses of columns or rows having greater than a predefined number of defective storage cells; and
  replace at least one of a row and a column having a stored address with a redundant row or column element and, after completion of the replacement of the at least one of the row and column by the redundant row or column element, replace at least one word containing one or more defective storage cells with a redundant word element without replacing an entire row comprising the at least one word.

* * * * *

UNITED STATES PATENT AND TRADEMARK OFFICE
CERTIFICATE OF CORRECTION

PATENT NO.         : 7,627,792 B2                                              Page 1 of 1
APPLICATION NO. : 10/777025
DATED              : December 1, 2009
INVENTOR(S)        : Mario Di Ronza et al.

It is certified that error appears in the above-identified patent and that said Letters Patent is hereby corrected as shown below:

In column 5, line 12, delete "Col address registers)" and insert --Col address register (j)--.

In column 5, line 17, delete "Col address registers)" and insert --Col address register (j)--.

Signed and Sealed this

Fifth Day of October, 2010

David J. Kappos
*Director of the United States Patent and Trademark Office*